United States Patent
Caletka et al.

(10) Patent No.: US 6,774,474 B1
(45) Date of Patent: Aug. 10, 2004

(54) PARTIALLY CAPTURED ORIENTED INTERCONNECTIONS FOR BGA PACKAGES AND A METHOD OF FORMING THE INTERCONNECTIONS

(75) Inventors: David V. Caletka, Apalachin, NY (US); Eric A. Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/438,037

(22) Filed: Nov. 10, 1999

(51) Int. Cl.[7] .......................... H01L 23/48; H01L 23/02; H05K 1/16

(52) U.S. Cl. ....................... 257/686; 257/734; 257/737; 257/778; 174/260

(58) Field of Search ................................ 257/778, 686, 257/738, 734, 737, 678, 779, 780, 786; 174/260; 438/611–613, FOR 343; 361/743

(56) References Cited

U.S. PATENT DOCUMENTS

| | | | | |
|---|---|---|---|---|
| 4,463,892 A | * | 8/1984 | Cusack et al. | 228/212 |
| 5,252,781 A | * | 10/1993 | Shirai et al. | 174/261 |
| 5,484,963 A | * | 1/1996 | Washino | 174/261 |
| 5,523,920 A | * | 6/1996 | Machuga et al. | 361/767 |
| 5,706,178 A | * | 1/1998 | Barrow | 361/777 |
| 5,742,483 A | | 4/1998 | Ma et al. | 361/777 |
| 5,859,474 A | | 1/1999 | Dordi | 257/737 |
| 5,872,399 A | * | 2/1999 | Lee | 257/738 |
| 5,875,102 A | | 2/1999 | Barrow | 361/777 |
| 5,885,849 A | * | 3/1999 | Distefano et al. | 438/108 |
| 5,977,632 A | * | 11/1999 | Beddingfield | 257/737 |
| 6,118,182 A | * | 9/2000 | Barrow | 257/773 |
| 6,194,667 B1 | * | 2/2001 | Jimarez et al. | 174/261 |
| 6,268,568 B1 | * | 7/2001 | Kim | 174/250 |
| 6,274,474 B1 | * | 8/2001 | Caletka et al. | 438/613 |
| 6,277,660 B1 | * | 8/2001 | Zakel et al. | 438/14 |

FOREIGN PATENT DOCUMENTS

| | | | |
|---|---|---|---|
| JP | 03-004545 | * | 10/1991 |
| JP | 6-92054 | * | 4/1994 |

OTHER PUBLICATIONS

"High Performance Carrier Technology: Materials And Fabrication", by Light et al, 1993 International Electronics Packaging Conference, San Diego, California, Volume One.

"High Performance Carrier Technology", by Heck et al, 1993 International Electronics Packaging Conference, San Diego, California, Volume One.

"Process Considerations in the Fabrication of Teflon Printed Circuit Boards", by Light et al, 1994 Proceedings, 44 Electronic Components & Technology Conference, 5/94.

* cited by examiner

*Primary Examiner*—Kamand Cuneo
*Assistant Examiner*—James Mitchell
(74) *Attorney, Agent, or Firm*—Schmeiser, Olsen & Watts; William H. Steinberg

(57) ABSTRACT

A Ball Grid Array package having an increased fatigue life and improved conductive pad adhesion strength, as well as providing sufficient wiring space within the package, is disclosed. In particular, solder joints having a combination of mask-defined and pad-defined solder joint profiles are formed using a mask having non-circular elongated openings. The non-circular elongated openings of the mask have a major axis and a minor axis, such that the dimension of the openings along the major axis is greater than the diameter of the conductive pads, and the dimension of the openings along the minor axis is less than the diameter of the conductive pads. In addition, the major axis of the openings within the mask are selectively oriented in the direction of highest stress for each solder joint within the package, while providing ample wiring space therein.

12 Claims, 10 Drawing Sheets

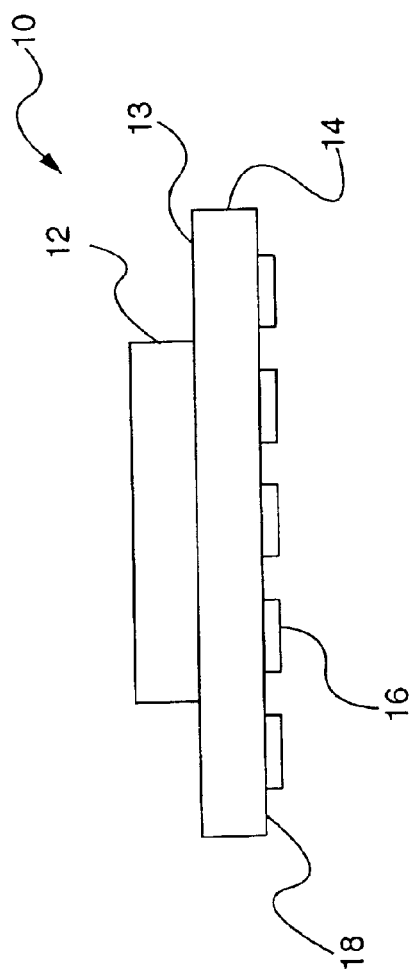
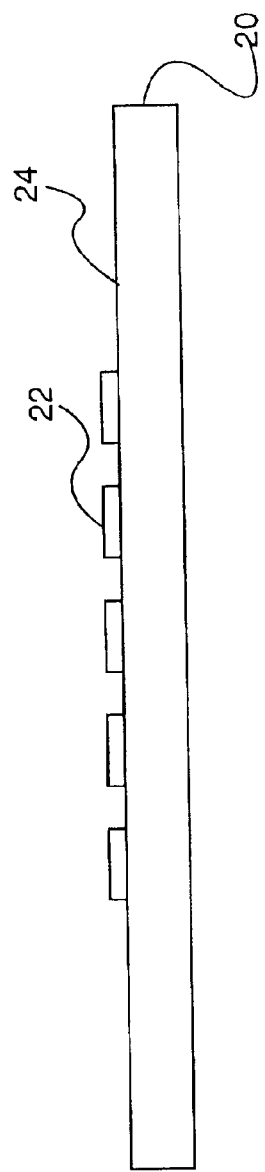
FIG. 1
FIG. 2

PARTIALLY CAPTURED ORIENTED INTERCONNECTIONS FOR BGA PACKAGES AND A METHOD OF FORMING THE INTERCONNECTIONS

BACKGROUND OF THE INVENTION

1. Technical Field

The present invention relates generally to Ball Grid Array (hereinafter "BGA") packages. In particular, the present invention relates to the use of partially captured interconnections, wherein the uncaptured region is selectively oriented in the direction of the highest stress within the BGA package.

2. Related Art

In the manufacture of BGA packages, thermal mismatch between the chip module and the printed circuit board may produce fatigue failure of the BGA interconnections, or solder joints. One solution for this problem is the elongation of the solder joints, which increases the compliance of the solder joints, thereby increasing the fatigue life of the BGA package. Solder joints have been elongated by the use of "captured pads" which form mask-defined solder joints. Along with increasing the height of the solder joint, the use of captured pads enhances the adhesion of the pads to the underlying chip module or printed circuit board. Unfortunately, stress concentrations within mask-defined solder joints tends to decrease the fatigue life of the solder joints. Alternative techniques employed to elongate the solder joints and increase fatigue life include the use of spacers, high-melt solder columns, selective solder joints containing an excess solder volume, etc. However, many of these techniques reduce the amount of space on the printed circuit board available for wiring.

Accordingly, there exists a need in the industry for a BGA package having an increased fatigue life, without sacrificing wiring space.

SUMMARY OF THE INVENTION

The present invention provides an integrated chip package, e.g., a BGA package, having an increased fatigue life, enhanced pad adhesion, while maintaining sufficient wiring space. In particular, the present invention provides a method of forming an integrated chip package having solder joints that are mask-defined in a first direction and pad-defined in a second direction.

The first general aspect of the present invention provides a method of forming an integrated chip package, comprising the steps of: providing a first substrate and a second substrate, each having conductive pads thereon; applying a mask to at least one of the first and second substrates, wherein the mask has a plurality of non-circular openings having a first dimension and a second dimension, such that the conductive pads are not covered by the mask in the direction of the first dimension and partially covered by the mask in the direction of the second dimension; and providing a reflowable material between the conductive pads of the first and second substrates. This aspect allows for an integrated chip package, e.g., a BGA package, having an increased fatigue life, without sacrificing wiring space. It also allows for an integrated chip package having solder joints that are mask-defined in a first direction and pad-defined in a second direction.

The second aspect of the present invention provides an integrated chip package comprising: a first substrate and a second substrate, wherein at least one of the first and second substrates includes a plurality of partially captured pads; and a plurality of interconnections between the first and second substrates. This aspect provides similar advantages as those associated with the first aspect.

The third aspect of the present invention provides a substrate having a plurality of conductive pads and a mask thereon, wherein the mask has a plurality of openings having a first dimension larger than the conductive pad, and a second dimension smaller than the conductive pad. This aspect provides similar advantages as those associated with the first aspect.

The fourth aspect of the present invention provides an integrated circuit mask having a plurality of elongated non-circular openings therein, wherein the openings have a first dimension greater than a second dimension, such that the first dimension of the openings coincides with the direction of the highest stress within integrated circuit. This aspect provides similar advantages as those associated with the first aspect.

The fifth aspect of the present invention provides an integrated circuit interconnection, wherein the interconnection is mask-defined in a first direction and pad-defined in a second direction. This aspect provides similar advantages as those mentioned with respect to the first aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 1 depicts a cross-sectional view of a semiconductor chip module (having a mask removed for clarity) in accordance with a preferred embodiment of the present invention;

FIG. 2 depicts a cross-sectional view of a printed circuit board (having a mask removed for clarity) in accordance with a preferred embodiment of the present invention;

DESCRIPTION OF THE PREFERRED EMBODIMENTS

Figure 3:
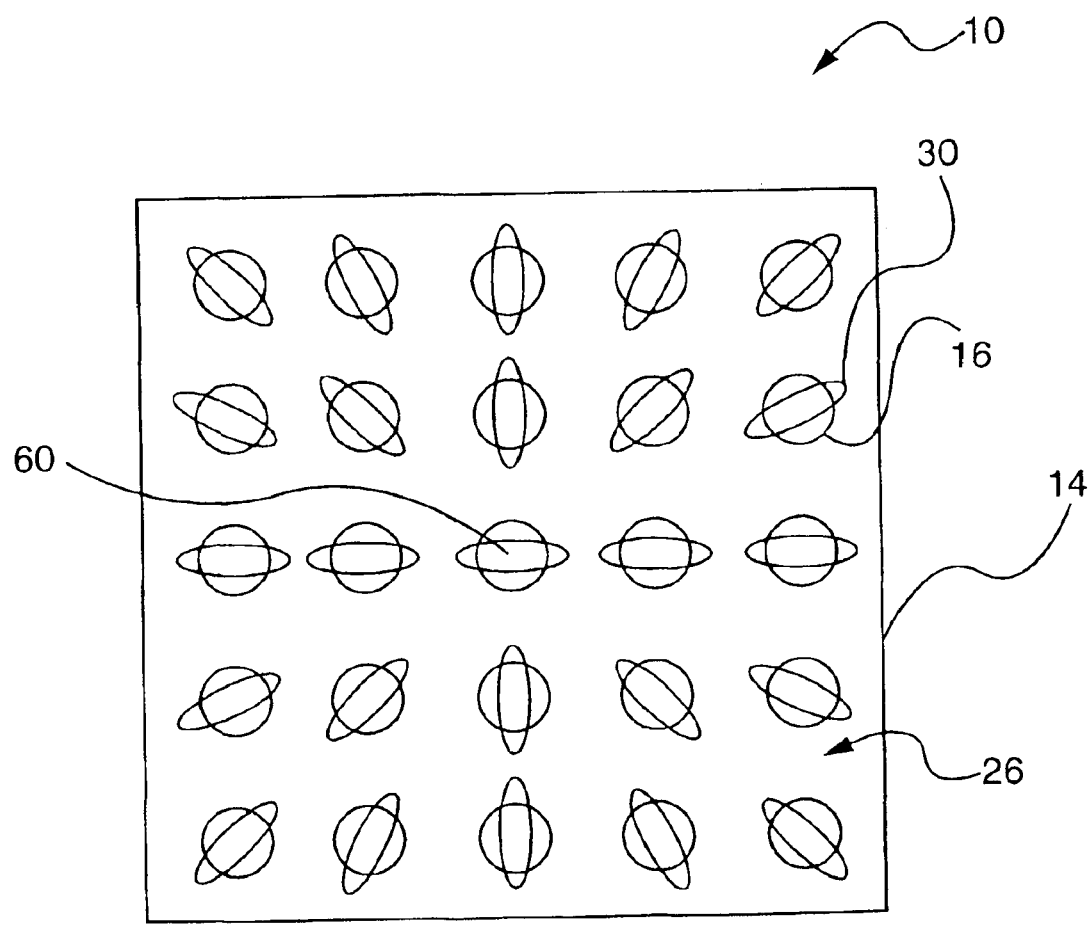
FIG. 3 depicts a bottom view of the semiconductor chip module having a mask thereon in accordance with a preferred embodiment of the present invention.

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Referring to the drawings, FIG. 1 shows a semiconductor chip module 10 having an integrated circuit chip 12 electrically and mechanically connected to a first surface 13 of a chip carrier 14. The chip carrier 14 is made of an insulative non-wettable material, such as ceramic, FR4, IBM's Dry-Clad™, LCP (Liquid Crystal Polymer) polyimide, etc. A plurality of circular conductive pads 16 are mounted on a second surface 18 of the chip carrier 14, using a process well known in the industry. The conductive pads 16 are preferably made of copper, or some other suitable material known and used in the art.

FIG. 2 shows a printed circuit card or board 20 upon which the module 10 will be mounted, The board 20 is made of an insulative non-wettable material, i.e., ceramic, FR4, IBM's Dry-Clad™, LCP (Liquid Crystal Polymer) polyimide, etc. A plurality of circular conductive pads 22 are affixed to a first surface 24 of the board 20. The conductive pads 22 are preferably copper, and coincide with the location of the conductive pads 16 on the chip carrier 14 of the module 10.

Figure 4:
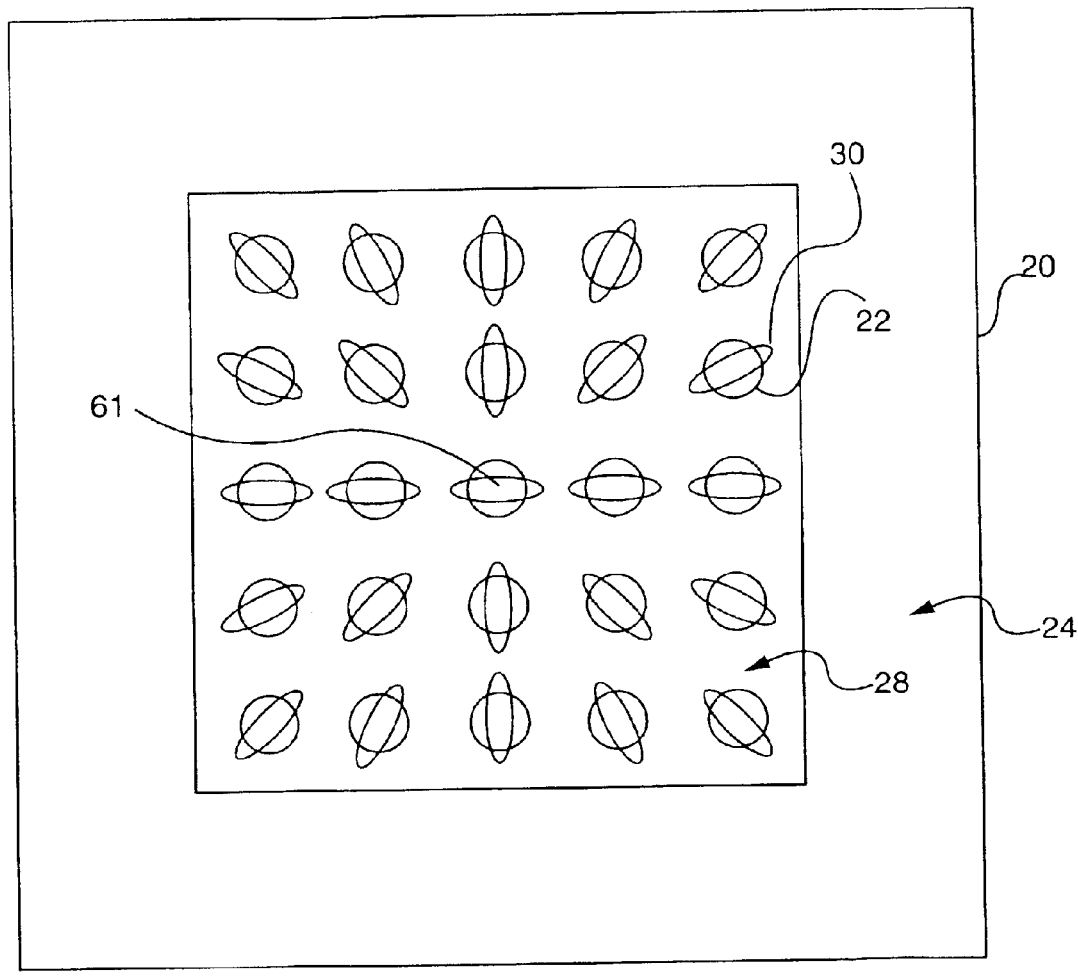
FIG. 4 depicts a top view of the printed circuit board having a mask thereon in accordance with a preferred embodiment of the present invention.
Figure 5:
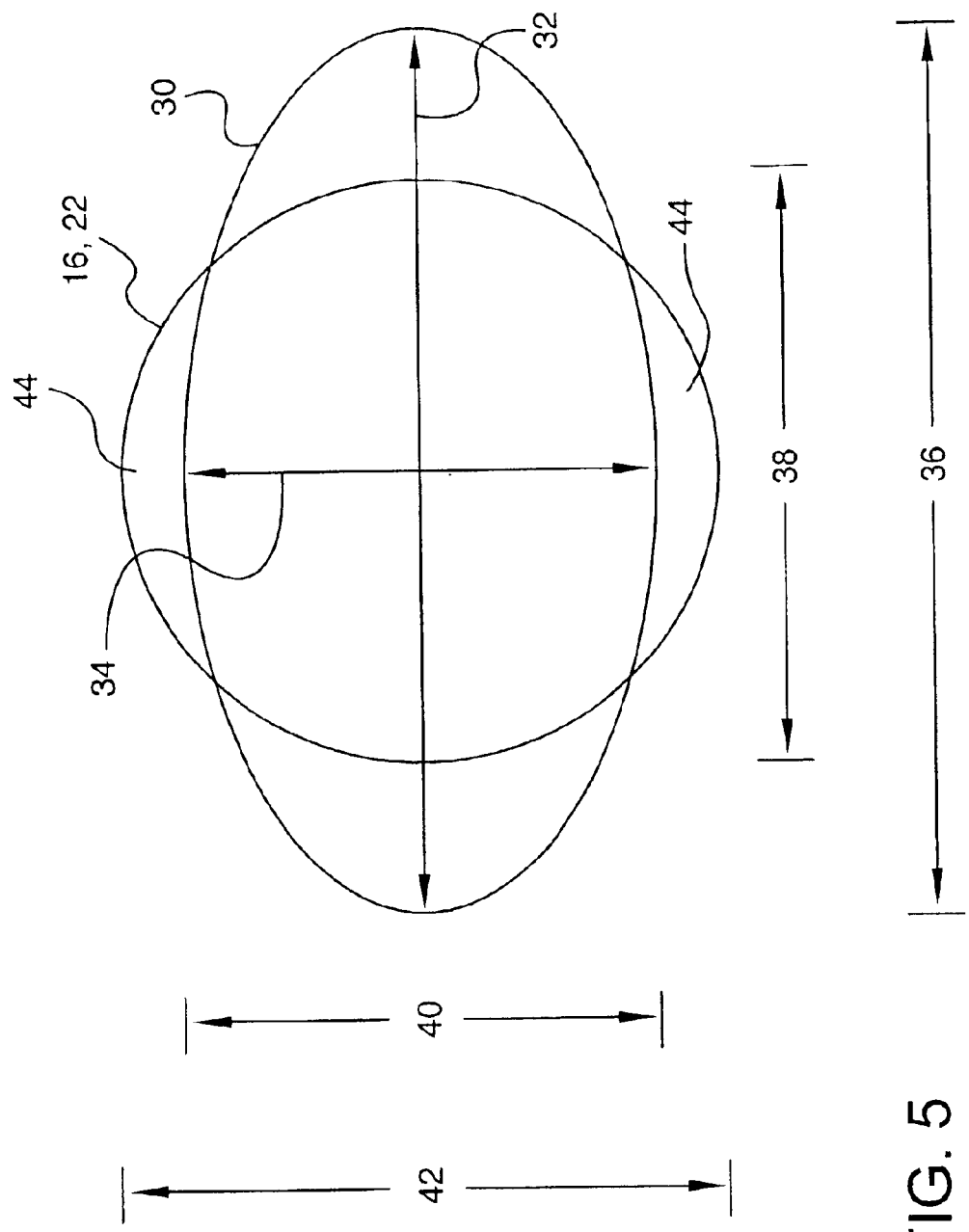
FIG. 5 depicts an enlarged view of an opening within the mask covering the semiconductor chip module and/or the printed circuit board in accordance with a preferred embodiment of the present invention.

FIG. 3 shows the second surface 18 of the chip carrier 14 (refer to FIG. 1) covered with a mask 26. Similarly, FIG. 4 shows the first surface 24 of the board 20 covered with a mask 28. The masks 26, 28 have elongated non-circular, oblong, oval, or elliptical openings 30 located over the conductive pads 16, 22. As illustrated in FIG. 5, the elongated openings 30 within the masks 26, 28 covering the conductive pads 16, 22, respectively, have a major axis 32 and a minor axis 34. The major axis 32 has a first dimension 36 that is greater than the diameter 38 of the conductive pads 16, 22. The regions of the conductive pads 16, 22 proximate the major axis 32 of the conductive pads 16, 22 are exposed or "un-captured" by the masks 26, 28. In contrast, the minor axis 34 has a second dimension 40 that is less than the diameter 42 of the conductive pads 16, 22. In regions 44, the conductive pads 16, 22 are partially covered or "captured" by the masks 26, 28.

Figure 6:
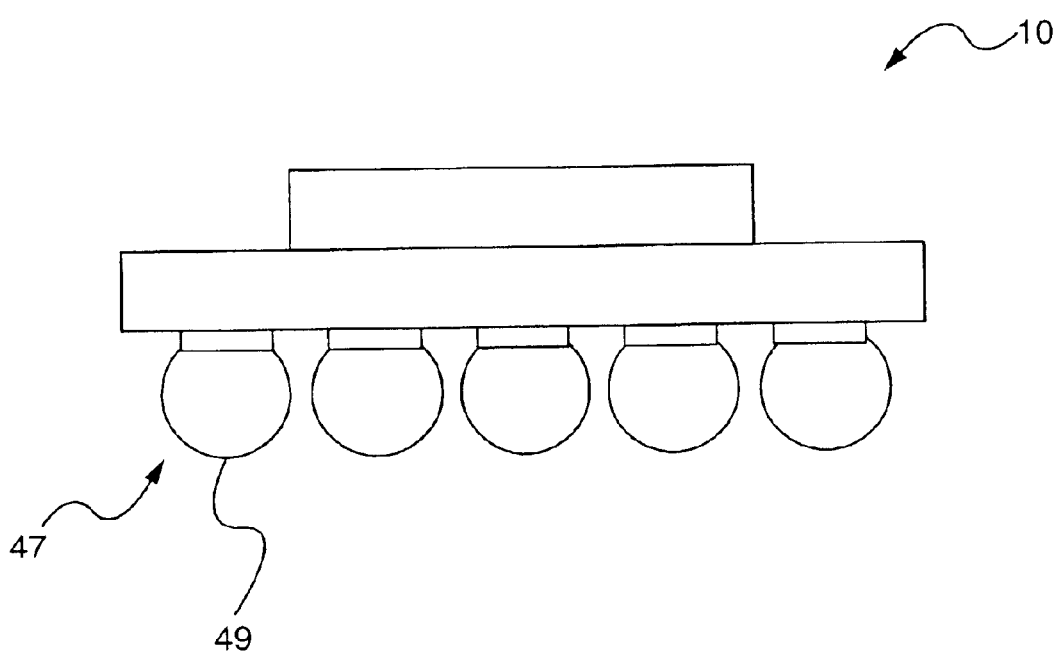
FIG. 6 depicts a cross-sectional view of the semiconductor chip module, with the mask removed for clarity, having solder balls attached thereto in accordance with a preferred embodiment of the present invention.
Figure 7:
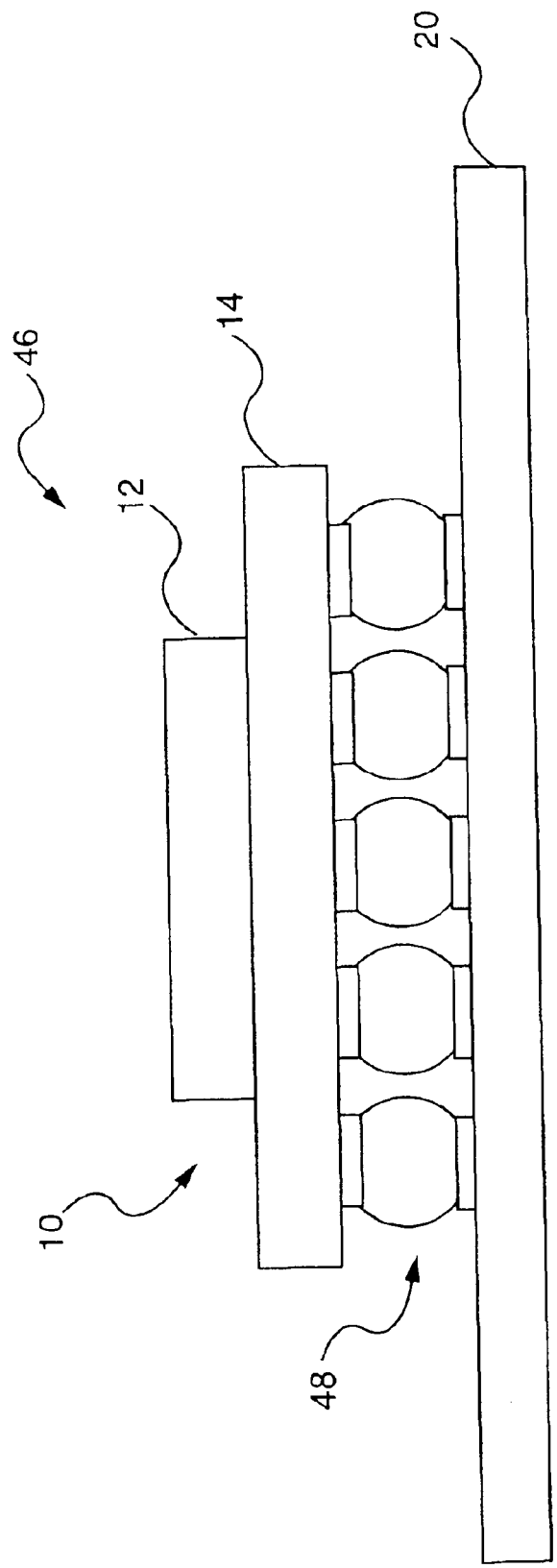
FIG. 7 depicts a cross-sectional view of an integrated chip package, with the mask removed for clarity, in accordance with a preferred embodiment of the present invention.

FIG. 6 shows a plurality of solder balls 47, having the mask 26 removed for clarity, attached or "wetted" to the exposed or un-captured regions of the conductive pads 16, using methods known in the industry. Specifically, the solder balls 47 wet to the regions of the conductive pads 16 that are not covered by the masks 26. The module 10, having solder balls 47 attached thereto, is then mounted to the board 20. In particular, the free ends 49 of the solder balls 47 wet to the exposed or uncaptured regions of the conductive pads 22 of the board 20, using methods well known in the art. FIG. 7 shows a cross-sectional view of an integrated chip package 46, in this example a BGA package, having the masks 26, 28 removed for clarity, produced after the module 10 and the board 20 are connected by a plurality of solder joints 48.

Figure 8:
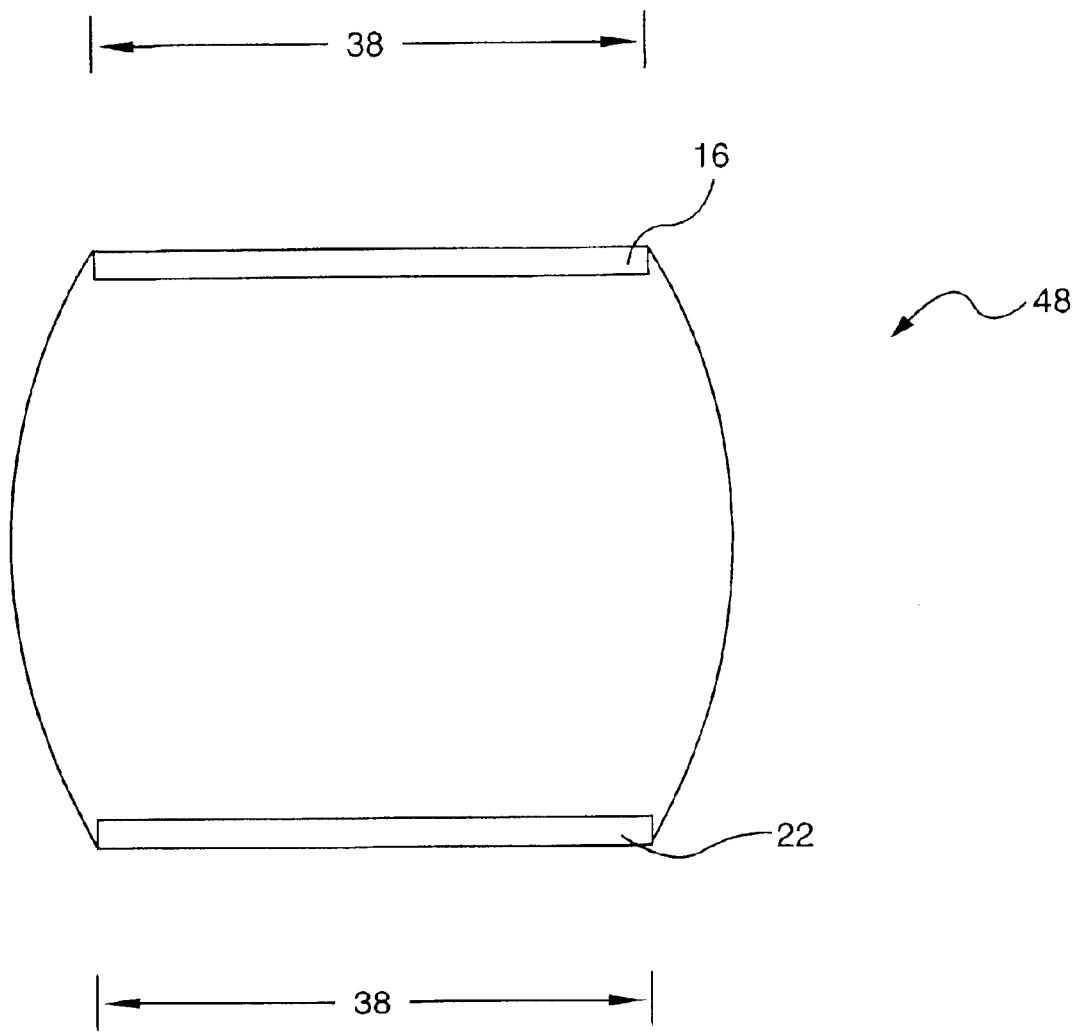
FIG. 8 depicts a cross-sectional view of a solder joint along the major axis of the mask opening, with the mask removed for clarity, in accordance with a preferred embodiment of the present invention.

FIG. 8 shows a cross-sectional view of a solder joint 48, having the mask 28 removed for clarity, taken along the major axis 32 of the openings 30 (refer to FIG. 5). In particular, the conductive pads 16, 22 of the module 10 and the board 20, respectively, are un-captured along the major axis 32. The wettable area (the area to which the solder balls adhere) of the conductive pads 16, 22 along the major axis 32 is equal to the diameter 38 of the conductive pads 16. Therefore, the solder balls 47 wet to the entire diameter 38 of the conductive pads 16, 22 forming un-captured or pad-defined solder joints in the direction of the major axis 32. The solder balls 47 do not wet to the surrounding surfaces 18, 24 of the chip carrier 14 and the board 20 because the chip carrier 14 and the board 20 are made of non-wettable materials.

Figure 9:
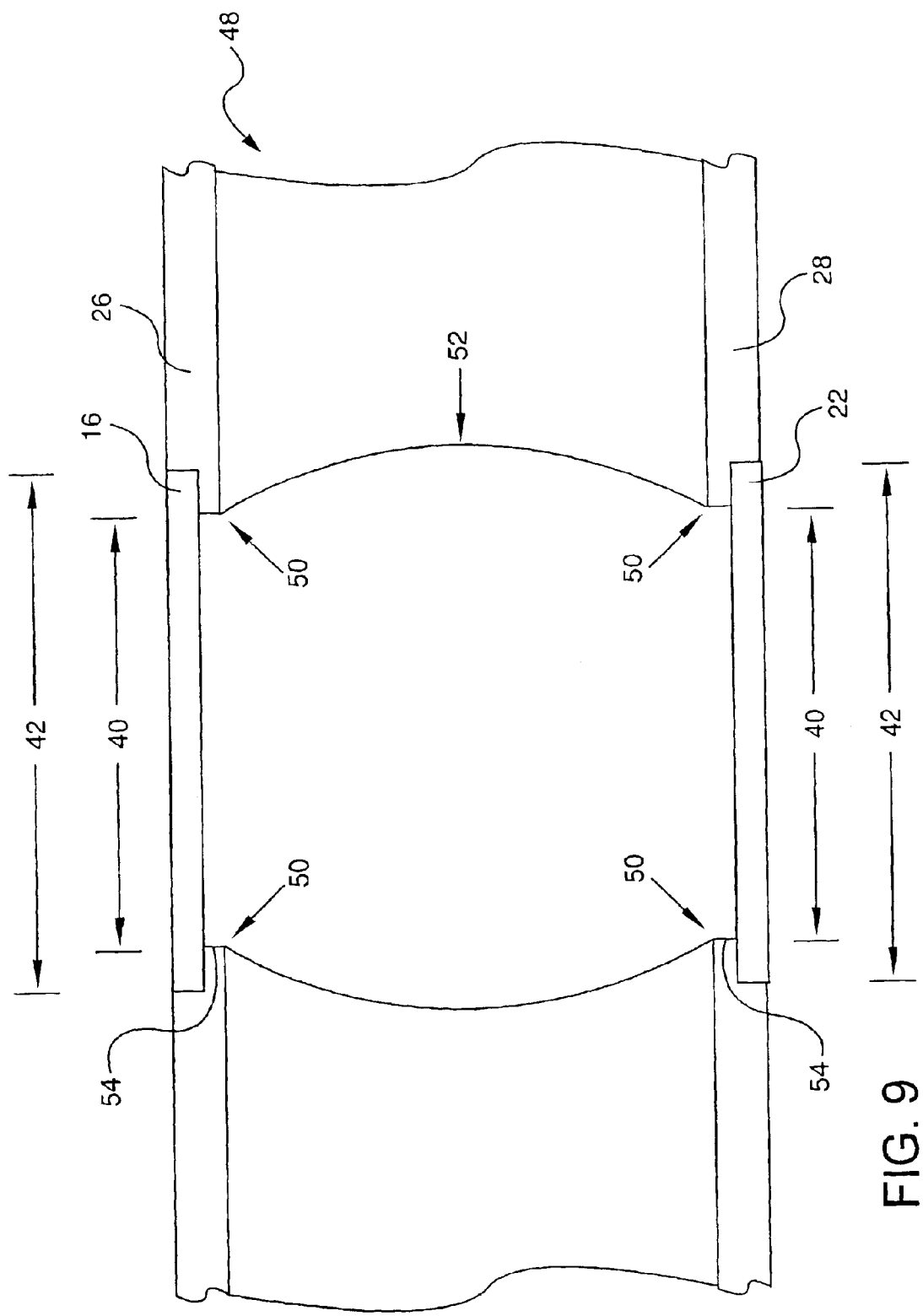
FIG. 9 depicts a cross-sectional view of a solder joint along the minor axis of the mask opening in accordance with a preferred embodiment of the present invention.

FIG. 9 shows a cross-sectional view of a solder joint 48 taken along the minor axis 34 of the openings 30 (refer to FIG. 5). The conductive pads 16, 22 of the module 10 and the board 20 are partially captured by the masks 26, 28 (see regions 44 shown in FIG. 5). Therefore, the wettable area of the conductive pads 16, 22 along the minor axis 34 is equal to the dimension 40 of the openings 30 in the masks 26, 28 in the direction of the minor axis 34, rather than the diameter 42 of the conductive pads 16, 22 (as in the direction of the major axis 32). As a result, the solder balls 47 wet only to the area of the conductive pads 16, 22 exposed by the openings 30 in the masks 26, 28 forming captured or mask-defined solder joints in the direction of the minor axis 34.

The major axis 32 of the elongated openings 30 is preferably selectively oriented in the direction of greatest stresses, predominantly shear stresses, within the solder joints 48 attached to the chip carrier 14 and the board 20. However, the major axis 32 of the elongated openings 30 may be oriented in any number of directions as needed or desired. FIGS. 3 and 4 depict a possible orientation that may be used, particularly for a square chip carrier 14 and board 20, wherein the stresses generally extend radially from a center 60, 61 of the chip carrier 14 and the board 20, respectively. The mask-defined solder joint profile taken along the minor axis 34, illustrated in FIG. 9, shows a plurality of discontinuities 50 within the solder joint 48, where the mid-section 52 abruptly meets a restricted section 54. Stress concentrations are present at the discontinuities 50 which tend to reduce the fatigue life of mask-defined solder joints if significant stress is applied to these regions. However, the profile of the pad-defined solder joint taken along the major axis 32, illustrated in FIG. 8, shows that no such discontinuities 50 are present within the high stress region.

The use of a solder joint 48 utilizing a combination of mask-defined and pad-defined solder joint profiles (see FIGS. 8 and 9) provides several advantages. For example, the mask-defined solder joints have a higher equilibrium height than pad-defined solder joints. Again, this is desirable because elongated solder joints tend to be more compliant, therefore less likely to fracture or break. Equilibrium height is the normal height reached by the solder joint as the internal pressure of the molten solder joint equals the weight that it supports. This is attributable to the restricted sections 54 of mask-defined solder joints (illustrated in FIG. 9), which tend to lengthen or elongate the solder joints 48. Further, mask-defined solder joints tend to have enhanced adhesion strength. Adhesion strength is the ability of the conductive pad to remain attached to the underlying substrate. In this case, the mask-defined solder joints (FIG. 9) enhance the adhesion strength of the conductive pads 16, 22 to the chip carrier 14 and the board 20, namely in regions 44 (refer to FIG. 5) where the masks 26, 28 cover the conductive pads 16, 22. These attributes are combined with pad-defined solder joints (illustrated in FIG. 8), which eliminate the internal stress concentrations found at the discontinuities 50 of the mask-defined solder joints (shown in FIG. 9). Therefore, using a mask having openings that form solder joints that are a combination of both pad-defined and mask-defined solder joints increases the fatigue life of the solder joints 48.

Figure 10:
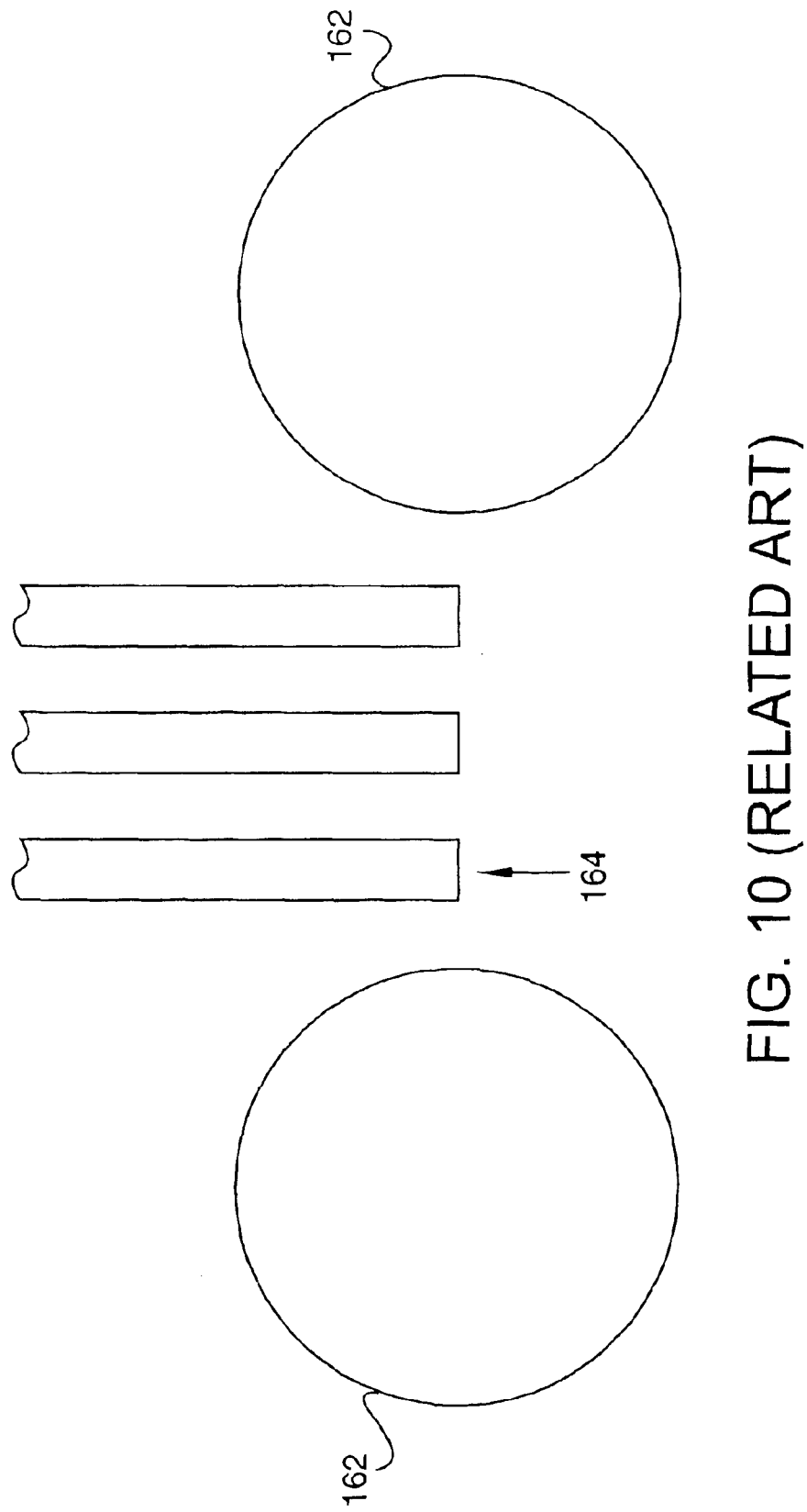
FIG. 10 depicts a top view of related art mask openings having a plurality of wires are mounted therebetween.
Figure 11:
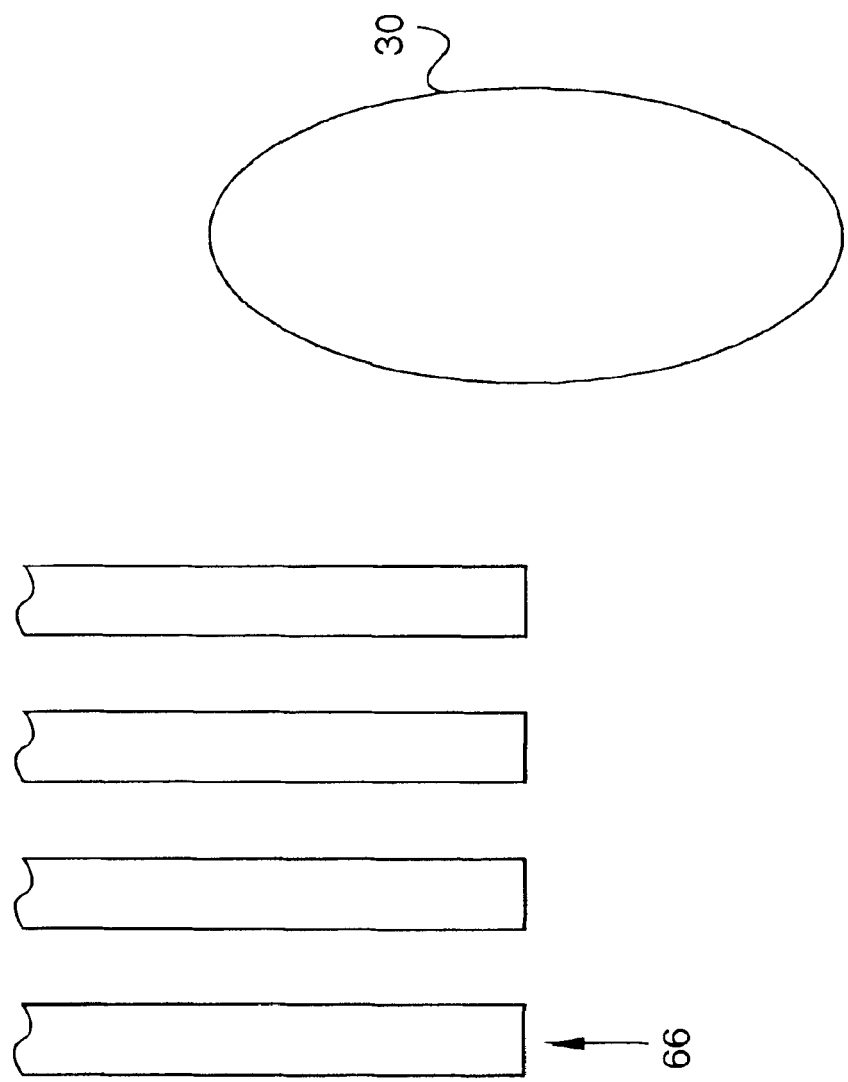
FIG. 11 depicts a top view of elongated mask openings having a plurality of wires mounted therebetween in accordance with a preferred embodiment of the present invention.
Figure 11:
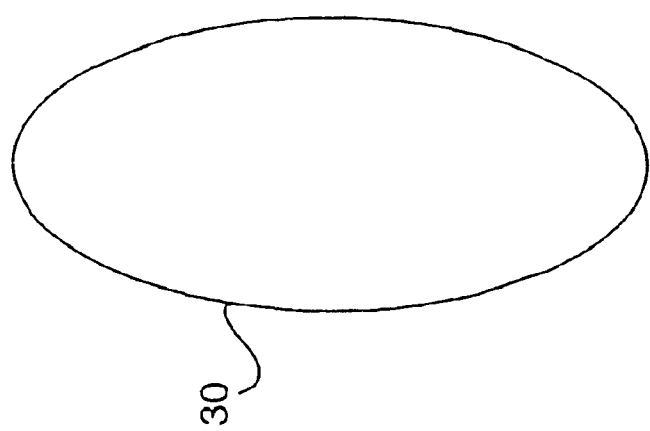

It should be noted that use of elongated openings 30, rather than round mask openings, also increases the space available for wiring. The major axis 32 of the openings 30 in the masks 26, 28 should be oriented in the direction of highest stress, taking into consideration the orientation that maximizes the space on the board 20 available for wiring. FIG. 10 shows the limited amount of space available for wiring when related art circular mask openings 162 are used with elliptical pads. Only three traces or wires 164 fit between the circular mask openings 162. In contrast, FIG. 11 shows the increased space available when elongated openings 30 are used in accordance with the preferred embodiment of the present invention. At least four traces or wires 66 fit between the elongated mask openings 30.

It should be understood that the oval-shaped elongated openings 30, oriented radially from the centers 60, 61 of the chip carrier 14 and the board 20, are solely an example. The elongated openings 30 are not limited to the size, shape or orientation described and illustrated herein. Likewise, the size and shape of the conductive pads 16, 22 are not limited by the disclosure above. A vast array of size, shape and orientation combinations may be used to suit particular needs.

It should also be noted that the mask does not have to be applied to both the chip carrier 14 and the board 20, as described above. Rather, the mask may be used on only one side of the BGA package, either the chip carrier 14 or the board 20. This would produce solder joints having the combination pad-defined and mask-defined solder joint profile, described and illustrated above, at one end of the solder joint and an alternative profile at the other end. For instance, the other end may have a solder joint profile that is entirely pad-defined or entirely mask-defined, etc.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. An integrated chip package comprising:
   a first substrate;
   a second substrate having a plurality of circular conductive pads formed thereon with a mask covering the second substrate and portions of said pads with a plurality of interconnections formed between the first substrate and the pads formed on the second substrate,
   said mask having a plurality of non-circular openings having an oblong shape, an oval shape, or an elliptical shape,
   wherein the openings have a first dimension and second dimension in a plane parallel to a top surface of the second substrate, and
   wherein the first dimension is greater than the second dimension and is larger than a diameter of the pads and the second dimension is smaller than the diameter, with the first dimension selectively oriented on the pad in a direction of highest stress within each interconnection.

2. The integrated chip package of claim 1, wherein the openings have the oblong shape.

3. The integrated chip package of claim 1, wherein the openings have the oval shape.

4. The integrated chip package of claim 1, wherein the openings have the elliptical shape.

5. The integrated chip package of claim 1, further comprising a plurality of traces mounted between the openings of the mask.

6. The integrated chip package of claim 1, wherein the mask comprises a non-wettable material.

7. The integrated chip package of claim 1, wherein the mask comprises an epoxy.

8. The integrated chip package of claim 1, wherein the first substrate is a chip carrier, and wherein the second substrate is a printed circuit board.

9. The integrated chip package of claim 1, wherein the first substrate is a chip carrier.

10. The integrated chip package of claim 1, wherein the first substrate is a printed circuit board.

11. The integrated chip package of claim 1, further comprising interconnections formed within the openings of the mask.

12. The integrated chip package of claim 11, wherein the interconnections are solder balls that wet only to an area of the conductive pads exposed by the openings in the mask.

* * * * *